United States Patent [19]

Knierim et al.

[11] Patent Number: 4,975,880
[45] Date of Patent: Dec. 4, 1990

[54] MEMORY SYSTEM FOR STORING DATA FROM VARIABLE NUMBERS OF INPUT DATA STREAMS

[75] Inventors: Daniel G. Knierim, Beaverton, Oreg.; John A. Martin, Milpitas, Calif.

[73] Assignee: Tektronix, Inc., Beaverton, Oreg.

[21] Appl. No.: 188,882

[22] Filed: May 2, 1988

[51] Int. Cl.⁵ .................. G11C 7/00; G11C 19/00; G06F 13/00

[52] U.S. Cl. ............... 365/189.02; 365/189.12; 365/238; 365/220; 364/243; 364/239.2; 364/238; 364/964; 364/939.5; 364/942

[58] Field of Search ... 364/200 MS File, 900 MS File; 365/78, 219, 189.02, 189.12, 220, 189.05, 238; 341/100

[56] References Cited

U.S. PATENT DOCUMENTS

| | | | |
|---|---|---|---|
| 3,344,406 | 9/1967 | Vinal | 364/900 |
| 3,916,380 | 10/1975 | Fletcher et al. | 364/200 |
| 4,377,843 | 3/1983 | Garringer et al. | 364/200 |
| 4,447,804 | 5/1984 | Allen | 341/100 |
| 4,588,986 | 5/1986 | Byrne | 341/100 |
| 4,620,180 | 10/1986 | Carlton | 341/100 |
| 4,646,270 | 2/1987 | Voss | 365/189.12 |
| 4,691,298 | 9/1987 | Fukuda et al. | 365/219 |
| 4,723,226 | 2/1988 | McDonough et al. | 365/189.05 |
| 4,796,232 | 1/1989 | House | 365/219 |

Primary Examiner—Thomas M. Heckler
Assistant Examiner—Gopal C. Ray
Attorney, Agent, or Firm—John J. Horn; Peter J. Meza

[57] ABSTRACT

The present invention constitutes a memory system comprising a multiple number of individual memory units (40–47) for storing digital data from a variable number of data input streams and for efficiently using the memory capacities of the memory units in the system by controlling the routing of data between the memory units. Each one of the memory units includes a set of input multiplexers (100–103), a set of shift/shadow registers (110–113) and a memory component (120) having a RAM memory array (121). The components of the memory units are implemented on a single integrated circuit chip. The input multiplexers allow alternate data streams to be selected for input to the shift/shadow registers. The shift/shadow registers are operative for enabling data to be transferred to and from the memory array at speeds slower than the rate at which these data are received by the system. The memory units are interconnected so that data can be routed from the outputs of the units to the inputs of other units in the system as alternative input data. Alternative memory systems are also provided which include memory units arranged for storing data bits of equal significance level within each memory unit through the use of internal connections between the outputs of shift/shadow registers and the input multiplexers in the units which facilitate the internal routing of data within individual memory units.

11 Claims, 7 Drawing Sheets though to record data from A/D converters or signal processors and then transfer the data to permanent memory at slower speeds. Further, such memory systems should ideally have the ability to handle a variable number of streams of input data and fully utilize the memory capacity of the system regardless of the actual number input channels in use.

It is therefore an object of the present invention to provide memory systems which allow for the temporary storage of large amounts of digital data received at high speeds over short time intervals.

It is another object of the present invention to provide memory systems having the ability to handle variable numbers of input data streams while efficiently utilizing the memory capacities of the systems in all cases.

It is a further object of the present invention to provide memory units implemented on single integrated circuit chips which are specially adapted for forming "programmable" memory systems having the temporary storage and variable data stream handling capabilities referred to above.

It is yet a further object of the present invention to provide memory systems comprised of memory units which require minimum amounts of ancillary logic or "glue logic" circuitry external to the chips on which the memory units are implemented for forming memory systems.

SUMMARY OF THE INVENTION

The present invention constitutes a memory system comprising a multiple number of specially designed memory units which are identical in construction for storing data provided in streams of multiple bit words from sources such as A/D converters. The memory units are constructed to allow input data from alternative sources to be delivered to each unit in response to control signals provided to the units. The memory units are interconnected to form the memory system. The memory system allows the memory capacities of all of the memory units to be efficiently utilized in recording data corresponding to variable numbers of input streams by proper programming of the control signals provided to the memory units.

Each of the memory units includes a set of input multiplexers, a set of "shift/shadow" registers and a memory component having a static RAM memory array. The memory unit components are all implemented on a single integrated circuit chip. Each one of the input multiplexers in the set is coupled to a different shift/shadow register and is adapted for selecting one of two alternative data input streams and providing the selected data to the shift/shadow register to which it is connected. Each one of the shift/shadow registers includes a conventional shift register and a "shadow" register which is adapted for holding data for transfer to the memory array in order to accommodate the slower speeds inherent in such operations. The shift/shadow registers are operative for transferring data in parallel into and out of the memory component in multiple bit groups.

The memory system is formed by connecting the outputs of the various memory units to the alternative inputs of other memory units. Data may then be routed among the memory units through use of proper control signals provided to the input multiplexers in the memory units. The memory capacities of all the memory units in the system can thereby be utilized even when fewer than the maximum number of data input streams are being received for recording of their data within the memory system.

In an alternative memory system, the memory units are arranged so that the individual memory units receive bits having equal significance levels within the words comprising the input data streams. The memory units used in this type of system include internal connection lines extending between the outputs and inputs of the different shift/shadow registers in each memory unit on each integrated circuit chip.

Each of these memory units may also include an output multiplexer connected to the outputs of the shift/shadow registers. The internal connection lines between shift/shadow registers allow data to be internally routed among the memory units so that the memory capacities of the units can be efficiently utilized. The output multiplexer functions to allow for selection of appropriate output data from each memory unit so that the selection of output data from the system can take place within the memory units. This type of alternative system minimizes the need for external "glue logic" circuitry for coordinating the operation of the memory units making up the memory system.

In a further type of alternative memory system, the memory units are arranged in complementary pairs which are interconnected to form a matrix. Each complementary pair within the matrix is connected for receiving a stream of input data to the system and supplying a stream of output data from the system. Additionally, each pair is connected to other pairs in the matrix for receiving two alternative streams of input data from other pairs and providing two streams of output data as alternative input data to other pairs. This type of memory matrix provides an efficient and flexible system for handling variable numbers of streams of input data provided to the memory system.

DETAILED DESCRIPTION OF PREFERRED EMBODIMENTS

Figure 1:
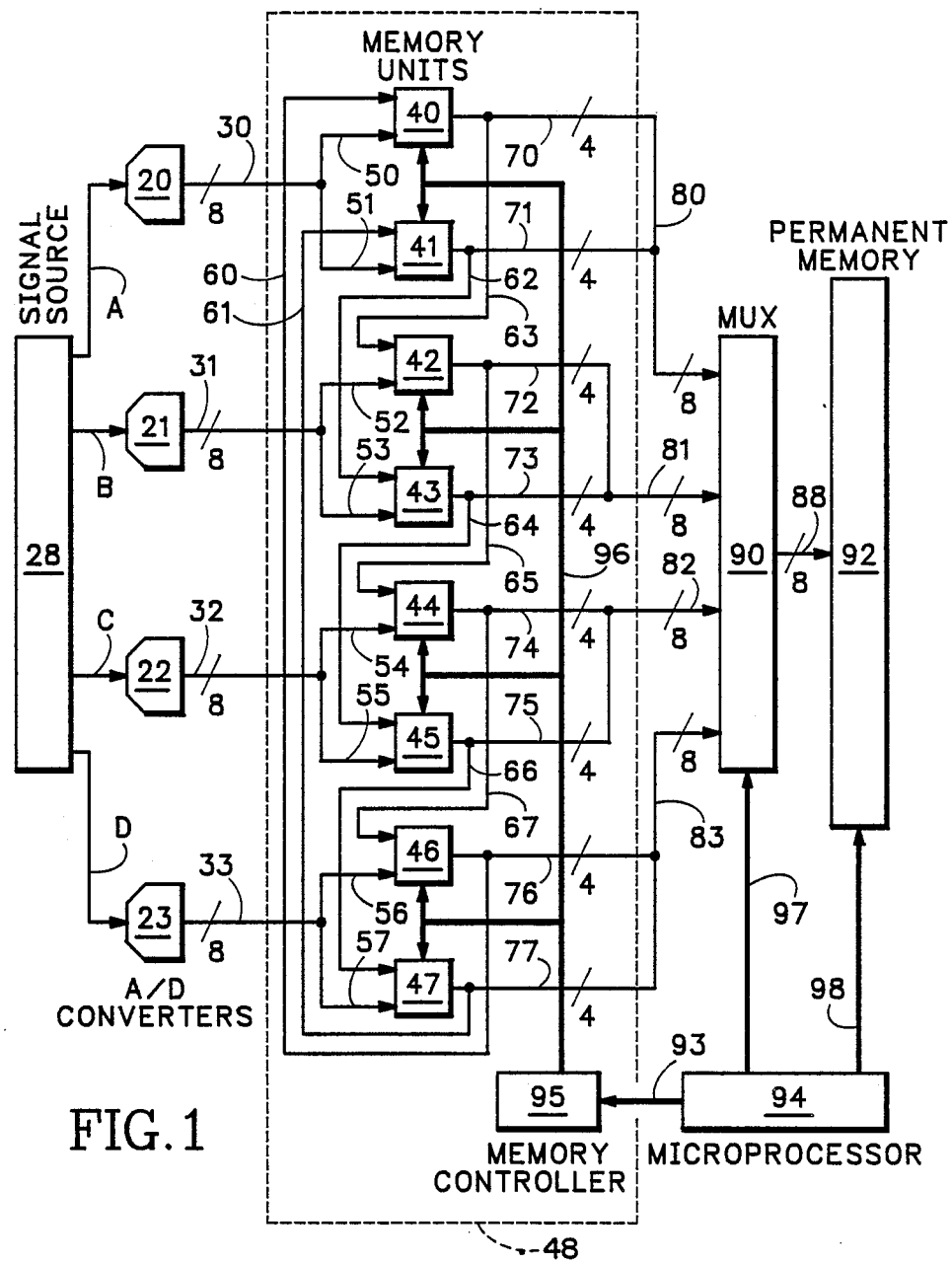
FIG. 1 is a schematic block diagram of a memory system in accordance with the present invention which can efficiently utilize the memory capacities of a multiple number of memory units for recording data corresponding to variable numbers of input signals.

Referring now to FIG. 1 four analog-to-digital ("A/D") converters 20, 21, 22 and 23 are arranged for sampling four separate analog signals provided by an analog signal source 28 on the channels A, B, C and D. The A/D converters 20-23 operate at a very high sampling rate such as 250 MHz. Each one of the A/D converters 20-23 produces a separate stream of eight bit bytes of digital data on the lines 30, 31, 32, and 33, respectively. Each of the lines 30-33 includes eight separate conducting leads for carrying eight bits of data in parallel. The leads within the lines 30-33 are split into groups containing four leads which form the lines 50 and 51, 52 and 53, 54 and 55, and 56 and 57, respectively. Each one of the lines 50-57 is connected to and serves as a primary data input line to one of the memory units 40-47, respectively.

The memory units 40-47 have additional input lines 60-67, respectively, each of which contain four leads. Input lines 60-67 connect to the output lines 76, 77 and 70-75, respectively, from the memory units 40-47, which also contain four leads. Each one of the lines 60-67 serves as an "alternative" data input line to one of the memory units 40-47. The output of each of the memory units 40-47 is thereby coupled to an input of one of the other memory units 40-47.

The leads from output lines 70 and 71 72 and 73, 74 and 75, and 76 and 77 are combined to form the lines 80, 81, 82 and 83, respectively, which serve as input lines to the multiplexer 90. Each of the lines 80-83 contains eight leads for carrying eight bits of data in parallel which form an eight bit byte of data. The multiplexer 90 is connected to a permanent memory component 92 by the line 88 which also contains eight parallel leads for carrying eight bits or one byte of data in parallel and which preferably constitutes part of the data bus associated with the microprocessor 94. The microprocessor 94 provides control and address signals over the bus lines 93, 97 and 98 to the memory controller 95 the multiplexer 90 and the permanent memory component 92. The memory controller 95 comprises a state machine and counter for use in generating high speed control and address signals (such as the signals $\overline{CS}$, DEN, S$\phi$, S1 and A$\phi$-A9 which will be later described). The memory controller 95 also includes a set of latches for holding and supplying to the memory units 40-47 other signals (such as the signals CP$\phi$ and R/$\overline{W}$) provided by the microprocessor 94.

In operation, the memory units 40-47 function as temporary storage for data provided at very high speed over short time intervals from the A/D converters 20-23. Each one of the memory units 40-47 is capable of receiving four bits of data at one time and each of the pairs 40 and 41, 42 and 43, 44 and 45, and 46 and 47 is capable of simultaneously handling eight bits of data or the full amount of data corresponding to one of the signal channels A-D. An effective rate of data processing of approximately 1 GHz may be achieved when all of the channels A-D and memory units 40-47 are in use.

The data from the A/D converters 20-23 are written into the memory units 40-47 in accordance with common address and control signals provided by the memory controller 95 over the bus line 96 to all of the memory units 40-47. Once they are recorded in the memory units 40-47, these data can be read out over the output lines 70-77 from the memory units 40-47 when required at a slower rate in accordance with signals again provided by the memory controller 95. These data are then supplied over the lines 80-83 to the multiplexer 90.

The multiplexer 90 functions to select data from one of the input lines 80-83 for supply to the output line 88 in response to control signals provided by the microprocessor 94 on the bus 97 line. The appropriate data can then be written into the permanent memory component 92 in accordance with further address and control signals provided by the microprocessor 94 over the bus 98 line to the memory component 92. It should be noted that the bus lines 97 and 98 preferably constitute part of a conventional bus structure associated with the microprocessor 94. Once the data from the A/D converters 20-23 are stored in the permanent memory 92, such data are then available for further processing under software control in whatever manner the operator desires.

However, the memory units 40-47 also form an interconnected structure 48 in which output data from the memory units 40, 41, 42, 43, 44, 45, 46 and 47 may be provided as input data to the memory units 42, 43 44, 45, 46, 47, 40 and 41, respectively, over the alternative input lines 60-67 in response to control signals provided by the memory controller 95. The memory controller 95 provides a separate control signal to each of the pairs 40 and 41, 42 and 43, 44 and 45, and 46 and 47 of memory units over the bus line 96 for regulating the routing of data between the memory units 40-47. The control signals allow the microprocessor to "program" the selection of data for storage within the memory units 40-47 from between the data supplied on the primary input lines 50-57 and the data supplied on the alternative input lines 60-67.

When all of the signal channels A-D are in use, the control signals from the memory controller 95 are set to select data supplied over the lines 50-57. However, the memory capabilities of the memory units 40-47 can be fully utilized when only channels A and C or B and D are in use by properly setting the control signals from the memory controller 95. For example, when only channels A and C are in use, the control signals from the memory controller 95 can be set to select data supplied over the lines 50 and 51, 62 and 63, 54 and 55, and 66 and 67. Data may then flow from the memory units 40 and 41 and memory units 44 and 45 into the memory units 42 and 43 and the memory units 46 and 47 respectively thereby fully utilizing the memory capacities of the memory units 40–47 and allowing twice the memory to be available for data from the two channels (A and C) in use.

The memory capabilities of the memory units 40–47 can likewise be fully utilized when only a single channel is in use. For example, when only channel A is in use, the control signals from the memory controller 95 can be set to select data supplied over the lines 50 and 51, 62 and 63 64 and 65, and 66 and 67. Data may then flow from the memory units 40 and 41 into the memory units 42 and 43, 44 and 45, and 46 and 47, thereby again fully utilizing the memory capacities of the memory units 40–47 and allowing four times the memory to be available for data from the single channel (A) in use.

It should be noted that the timing of the internal operations of the memory units 40–47 must be modified to reflect the use of the memory units in combination with one another. In particular, the frequency of parallel data transfer operations within the memory units must be reduced to reflect the use of more than one memory unit in processing data from single input data streams as will be better understood with respect to the explanations hereinafter provided with respect to the structure of the memory units 40–47.

Figure 2:
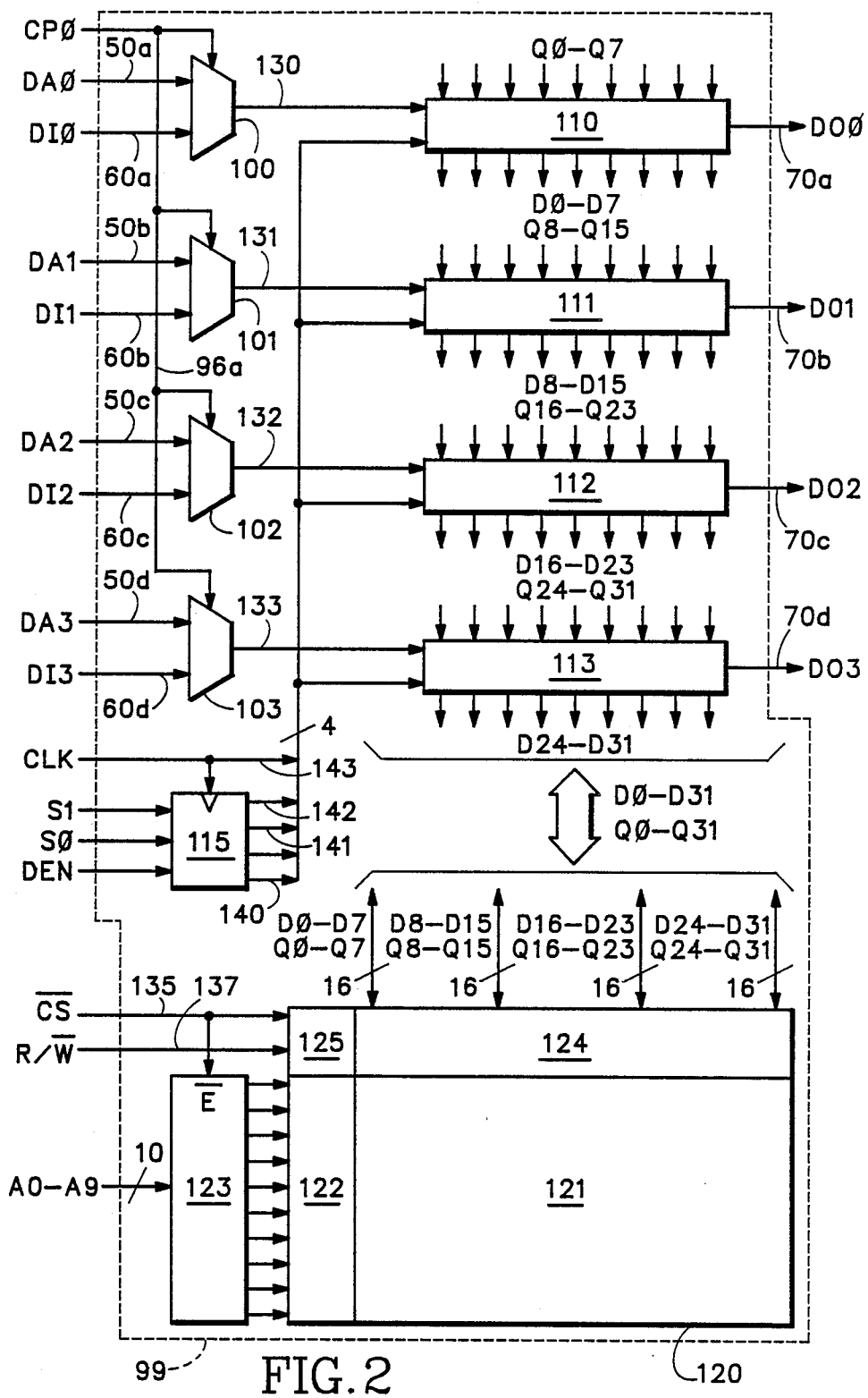
FIG. 2 is a schematic block diagram of a memory unit in accordance with the present invention and of a type suitable for being employed in the system shown in FIG. 1.

Referring now to FIG. 2, the memory units 40–47 each comprise various circuit components and associated input and output lines which are all constructed on a common substrate so that the units 40–47 each constitute a single integrated circuit chip 99. The circuit components for a representative memory unit, such as the unit 40, comprise four 2×1 input multiplexers 100–103, four eight-bit "shift/shadow" registers 110–113, a control buffer register 115 and a read/write memory component 120.

The memory component 120 is of conventional complementary metal-oxide semiconductor ("CMOS") construction and includes a static memory array 121 of randomly accessible memory cells, an address decoder 122, a group of ten latches 123 for temporary holding address information, a group of write drivers and sense amplifiers 124 and a memory control circuit 125. The RAM array 121 contains 16K of memory which is 32 bits wide and 513 words deep. The address signals A$\phi$–A9 and the control signals $\overline{CS}$ and R/$\overline{W}$ are supplied to the latches 123 and control circuit 125, respectively, over the control lines 135 and 137 from the bus line 96. The data input lines for the signals D$\phi$–D31 going to the write drivers and sense amplifiers 124 (and the memory array 121), and the data output lines for the signals Q$\phi$–Q31 coming from the write drivers and sense amplifiers 124 (and the memory array 121) are connected to the shift/shadow registers 110–113.

Each one of the shift/shadow registers 110–113 is coupled to the memory component 120 by a separate line containing 16 leads for supplying data in parallel to and receiving data in parallel from the array 121. The input multiplexers 100–103 of the memory unit 40 are separately connected to the data input leads 50a–50d and 60a–60d (comprising the respective lines 50 and 60) carrying the signals DA$\phi$–DA3 and DI$\phi$–DI3, respectively. Each one of the multiplexers 100–103 is associated with a different one of the shift/shadow registers 110–113, respectively.

Data from either the signals DA$\phi$–DA3 or the signals DI$\phi$–DI3 are alternatively supplied through the multiplexers 100–103 over lines 130, 131, 132, and 133 to the shift/shadow registers 110–113 in response to the control signal CP$\phi$ provided over the bus lead 96a to each of the multiplexers 100–103. When CP$\phi$ is high, data from the primary input signals DA$\phi$–DA3 is selected for supply to the registers 110–113, respectively. When CP$\phi$ is low, data from the alternative input signals D1$\phi$–D13 is selected for supply to the registers 110–113, respectively. It should be noted that a different control signal CP$\phi$–CP3 must be furnished to each of the pairs of memory units 40 and 41, 42 and 43, 44 and 45 and 46 and 47 for regulating the selection of input data for supply to the sets of shift/shadow registers (such as the registers 110–113) in each of the memory units 40–47.

The control buffer register 115 is adapted for holding data provided by the control signals S0, S1 and DEN in accordance with the clock signal CLK provided over the bus line 96. The data from the signals S0, S1 and DEN is entered into three flip-flops which form control buffer register 115 and which are used to drive the lines 140, 141 and 142 to the shift/shadow registers 110–113. The control buffer register 115 therefore operates as a driver and helps to ensure that the control signals S0, S1 and DEN are properly synchronized to the clock signal CLK. The control signals S0, S1 and DEN and the clock signals CLK are supplied on the lines 140–143 to each of the shift/shadow registers 110–113.

Figure 3:
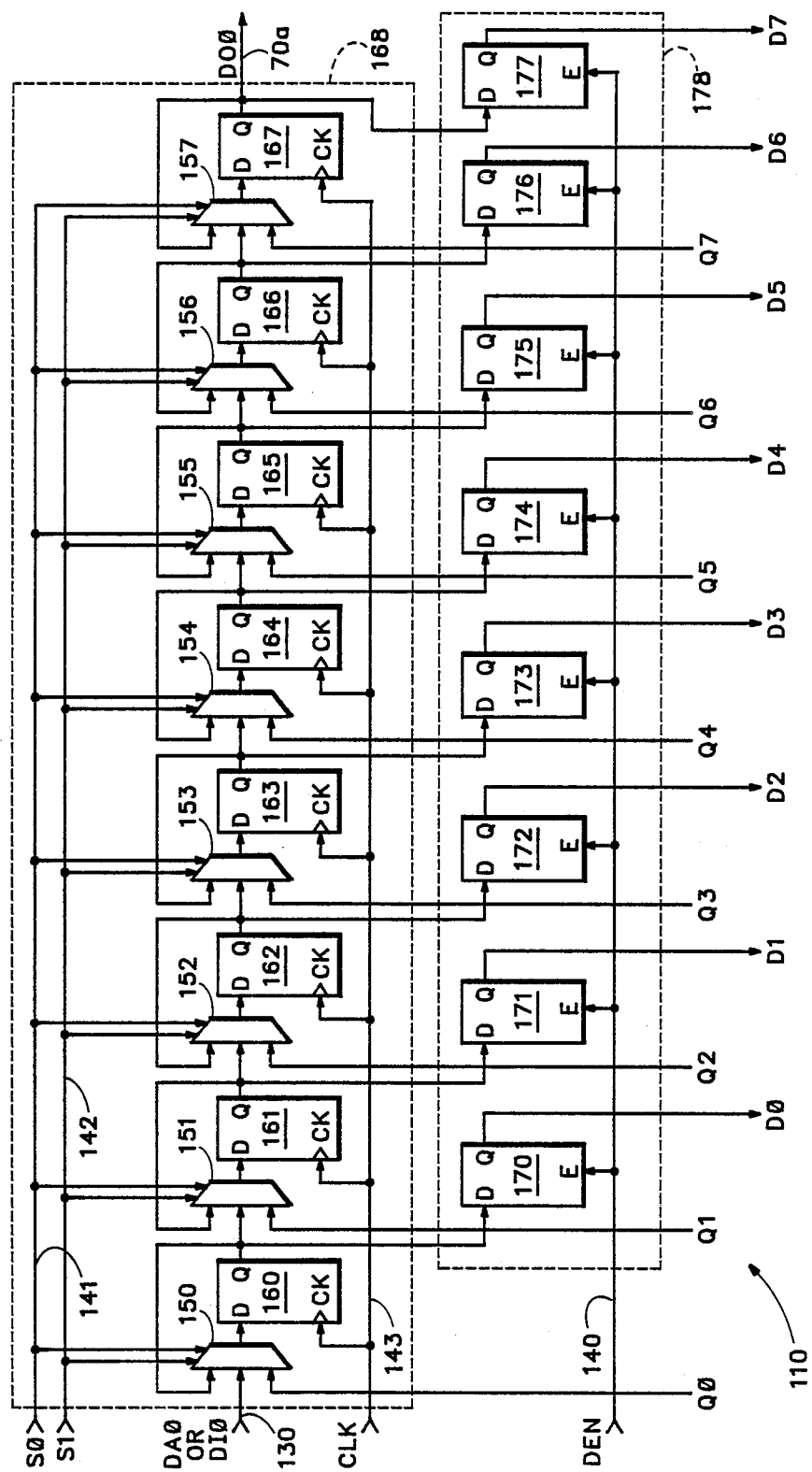
FIG. 3 is schematic diagram of a shift/shadow register component in accordance with the present invention and of a type suitable for being employed in the memory units shown in FIGS. 2 and 6.

The shift/shadow registers 110–113 operate as an interface between the data lines 130–133 (signals DA$\phi$–DA3 or DI$\phi$–DI3), the memory array 121 and the data output leads 70a–70d (signals DO$\phi$–DO3). Referring now to FIG. 3, the circuit components for a representative shift/shadow register, such as the register 110, comprise eight 3×1 multiplexers 150–157, eight D flip-flops 160–167 and eight latches 170–177. The flip-flops 160–167 are connected together in a series with the Q outputs of preceding flip-flops coupled to the D inputs of following flip-flops in order to form a conventional type eight bit shift register 168.

A serial stream of input data may be provided to the register 168 on line 130 and the data comprising the input stream sequentially entered into the flip-flops 160–167. Alternately, a stream of serial output data may be sequentially supplied from the register 168 on lead 70a based on data previously entered into the flip-flops 160–167. All of the flip-flops 160–167 are connected together through the multiplexers 150–157 one of which is directly connected to the D input of each of the flip-flops 160–167. The multiplexers 150–157 allow the input data for each of the flip-flops 160–167 to be selected from either the Q output data of the previous flip-flop in the series comprising the register 168 (or "new" data on line 130) or output data (from one of the signals Q$\phi$–Q7) read out from the RAM memory array 121 or the Q output data provided by the flip-flop itself.

The Q outputs of the flip-flops 160–167 are also connected to the D inputs of the latches 170–177 respectively. The latches 170–177 form a "shadow" register 178 for holding data for transfer to the memory component 120 at a transfer rate substantially slower than the rate of operation of the shift register 168. The shadow register 178 functions to buffer the transfer of data from the shift registers 110–113 to the RAM array 121 of the memory component 120. The Q outputs of the latches 170–177 are in turn connected to provide input data (signals Dφ–D7) to the memory component 120 and the RAM memory array 121. The multiplexers 150–157 provide their selection function in response to the control signals S0 and S1 from the control buffer register 115. The clock signal CLK is provided on line 143 to each of the flip-flops 160–167 for regulating operational timing. The data enable signal DEN is furnished on line 140 to each of the latches 170–177 in order to provide a timing function appropriate for their operation.

The shift/shadow register 110 operates in one of three modes When the control signals S0 and S1 are both high, the register 168 functions as a conventional shift register for receiving data from the signal (DAφ or DIφ) provided on line 130 or supplying data as the signal DOφ on lead 70a. When the signal DEN also goes high, the Q output data from the flip-flops 160–167 are entered into the latches 170–177 from where such data can be written into the array 121 as the data input signals Dφ–D7 at a transfer rate compatible with the CMOS technology of the memory component 120. When S1 is high and S0 is low, the flip-flops read their own Q outputs so that the logic statuses of the flip-flops 160–167 all remain the same. When S1 is low (regardless of S0) the flip-flops 160–167 read data from the memory output signals Qφ–Q7 from the memory array 121 of the memory component 120.

In order for data to be written into the memory array 121, the R/$\overline{W}$ control line 137 to the memory component 120 is held low and the shift/shadow register 110 is placed in the shift mode of operation through the action of the signals Sφ and S1. After every eight shifts whereby eight new data bits are entered into the shift register 168, the DEN line 140 is set high for one clock cycle to transfer these data bits into the shadow register 178. The $\overline{CS}$ control line 135 to the memory component 120 is then set low for an appropriate time to write the data held in the shadow register 178 into the address location designated by the address signals Aφ–A9 within the memory array 121. If further data is to be written into memory, the memory controller 95 would then increment the address value carried by the address signals Aφ–A9 in preparation for the next write cycle. Since the signals DEN and $\overline{CS}$ are activated only once every eight clock cycles, the clock frequency may be eight times faster than the cycle rate in accordance with which data is written to the memory array 121.

In order for data to be read from the memory array 121, the R/$\overline{W}$ control line 137 to the memory component 120 is held high and the $\overline{CS}$ control line 135 to the memory component 20 is set low for an appropriate time to read the data from the address location designated by the address signals Aφ–A9 within the memory array 121 and allow the data to be presented to the shift register 168. The shift/shadow register 110 is then placed in the parallel load mode for one clock cycle and the shift mode for the next seven clock cycles through the action of the signals Sφ and S1. If further data is to be read from memory, the memory controller 95 would simultaneously increment the address value carried by the address signals Aφ–A9 and start the next read cycle such that a new data word from the memory array 121 would be present to be loaded into the shift register 168 after the seventh shift cycle. Again, since operations directly involving the memory component 120 take place only once every eight clock cycles, the clock frequency may be eight times faster than he cycle rate in accordance with which data is read from the memory array 121.

It should be noted that if the input multiplexers (e.g. multiplexers 100–103) within the memory units 40–47 are set so as to link the outputs of certain shift/shadow registers (e.g. registers 110–113) to the inputs of other shift/shadow registers the effective length of each shift/shadow register is longer. Consequently, the number of shifts between access to the memory array (e.g. array 121) must also be correspondingly greater.

The hold mode for the shift/shadow register 110 (in which the statuses of the flip-flops 160–167 remain the same) is used to reduce the rates of data input to or data output from the memory units 40–47. For instance, in order to reduce the output rate by a factor of ten (and be compatible with the speed of the permanent memory 92), nine hold operations would be inserted between the shift operations and shift and load operations described above.

Figure 4:
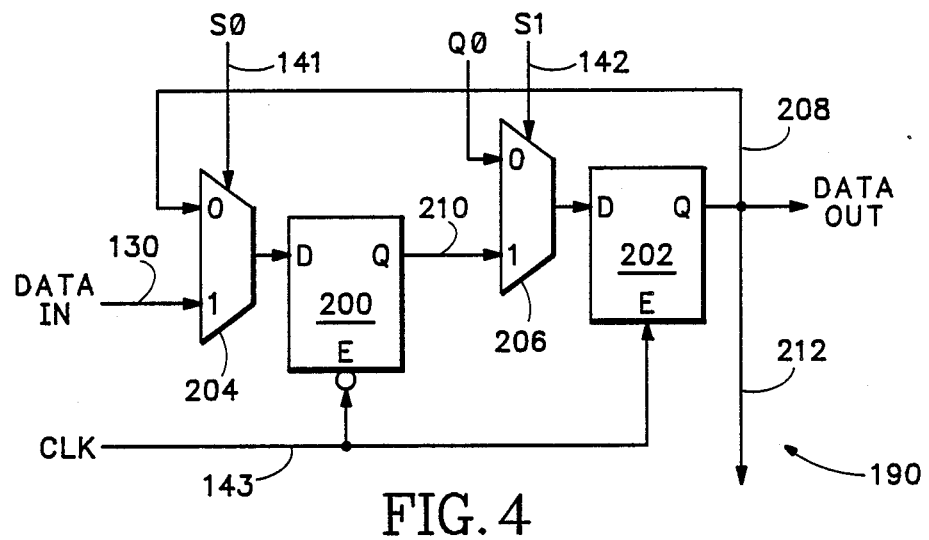
FIG. 4 is a detailed schematic diagram of an individual flip-flop and associated multiplexer in accordance with the present invention and of a design suitable for use in the shift/shadow register shown in FIG. 3.

Referring now to FIG. 4, a differential current-mode logic ("DCML") structure 190 is shown for a representative flip-flop and multiplexer combination within the register 168, such as the flip-flop 160 and multiplexer 150. The combination includes two latches 200 and 202 (master latch 200 and slave latch 202) and two 2×1 multiplexers 204 and 206 which have their outputs directly connected to the D inputs of the latches 200 and 202, respectively.

The multiplexer 204 is connected to receive input data from line 130 on its "high" input and alternatively to receive the Q output of the latch 202 from line 208 on its "low" input. The multiplexer 204 is also connected to line 141 over which the signal S0 is provided for controlling input selection. The multiplexer 206 is connected to receive the Q output of latch 200 from line 210 on its "high" input and to receive the input data signal Qφ on its "low" input from the memory array 121. The multiplexer 206 is also connected to line 142 over which the signal S1 is provided for controlling input selection. The Q output of the latch 202 is additionally connected to line 212 which leads to the D input of the latch 170. The clock signal CLK is provided over line 143 to the enable input of latch 202, while the inverse of the clock signal CLK is provided to the enable input of the latch 200.

The structure formed by the latches 200 and 202 and multiplexers 204 and 26 as shown in FIG. 4 provides the three modes of operation previously described. Furthermore, the structure formed by the latches 200 and 202 and multiplexers 204 and 206 can be implemented using only two DCML "trees" and therefore is a particularly efficient method of designing the components which make up the register 168.

Figure 5:
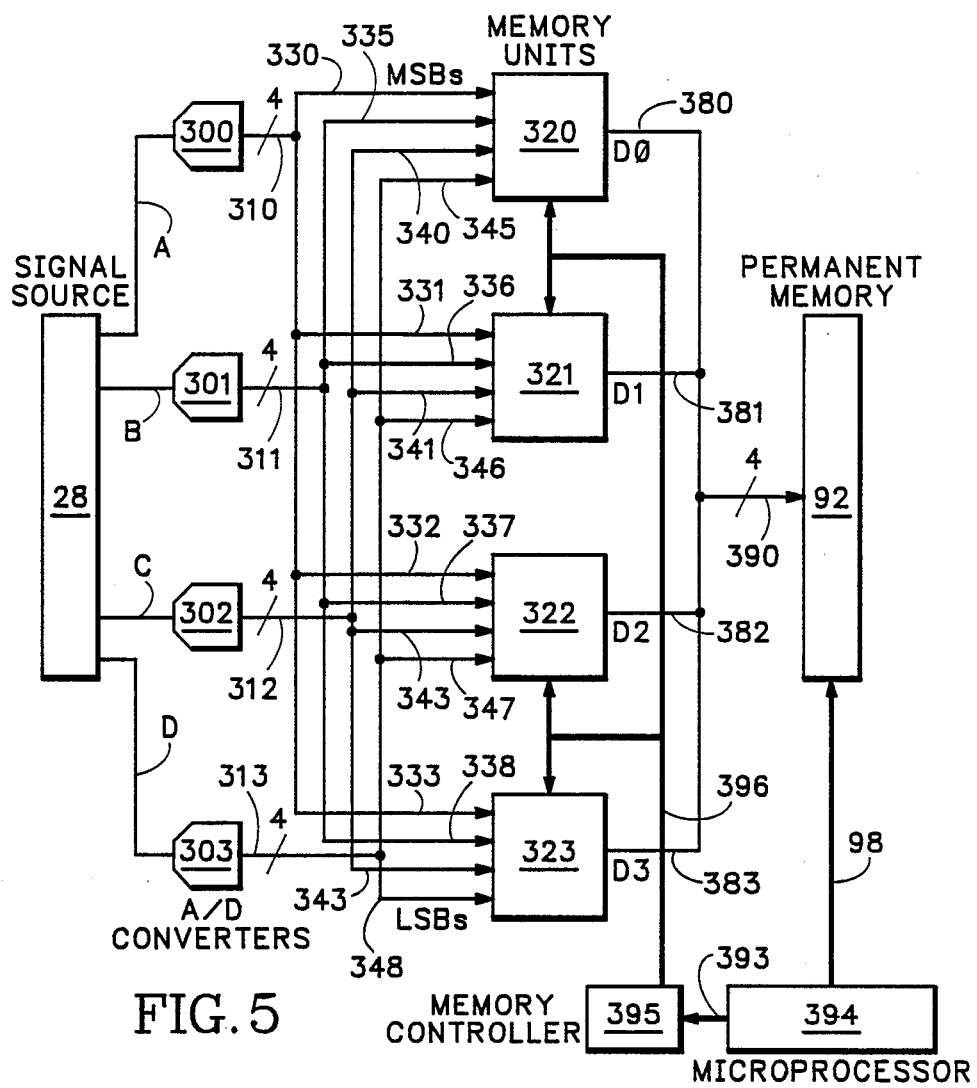
FIG. 5 is a schematic block diagram of an alternative type of memory system in accordance with the present invention for efficiently utilizing the memory capacities of multiple memory units in a different manner.

Referring now to FIG. 5, four A/D converters 300, 301, 302 and 303 are arranged, as in FIG. 1, for sampling analog input signals from a signal source 28 provided on channels A, B, C, and D at a high sampling rate such as 250 MHz. In this case, each of the A/D converters 300–303 produces a stream of four bit words of digital data on the lines 310, 311, 312, and 313. Each of the lines 310–313 contains four leads for carrying four bits of data in parallel.

The individual leads within each of the lines 310–313 are separately connected to different memory units 320, 321, 322 and 323. The leads 330, 335, 340 and 345 carrying the most significant bits of data are all connected to the memory unit 320. The leads 331, 336, 341 and 346 carrying the second most significant bits of data are all connected to the memory unit 321. The leads 332, 337, 342 and 347 carrying the 3rd most significant bits of data are all connected to the memory unit 322. The leads 333, 338 343 and 348 carrying the least significant bits of data are all connected to the memory unit 323. Each of the memory units 320-323 receives bits of equal significance level from the A/D converters 300-303.

Figure 6:
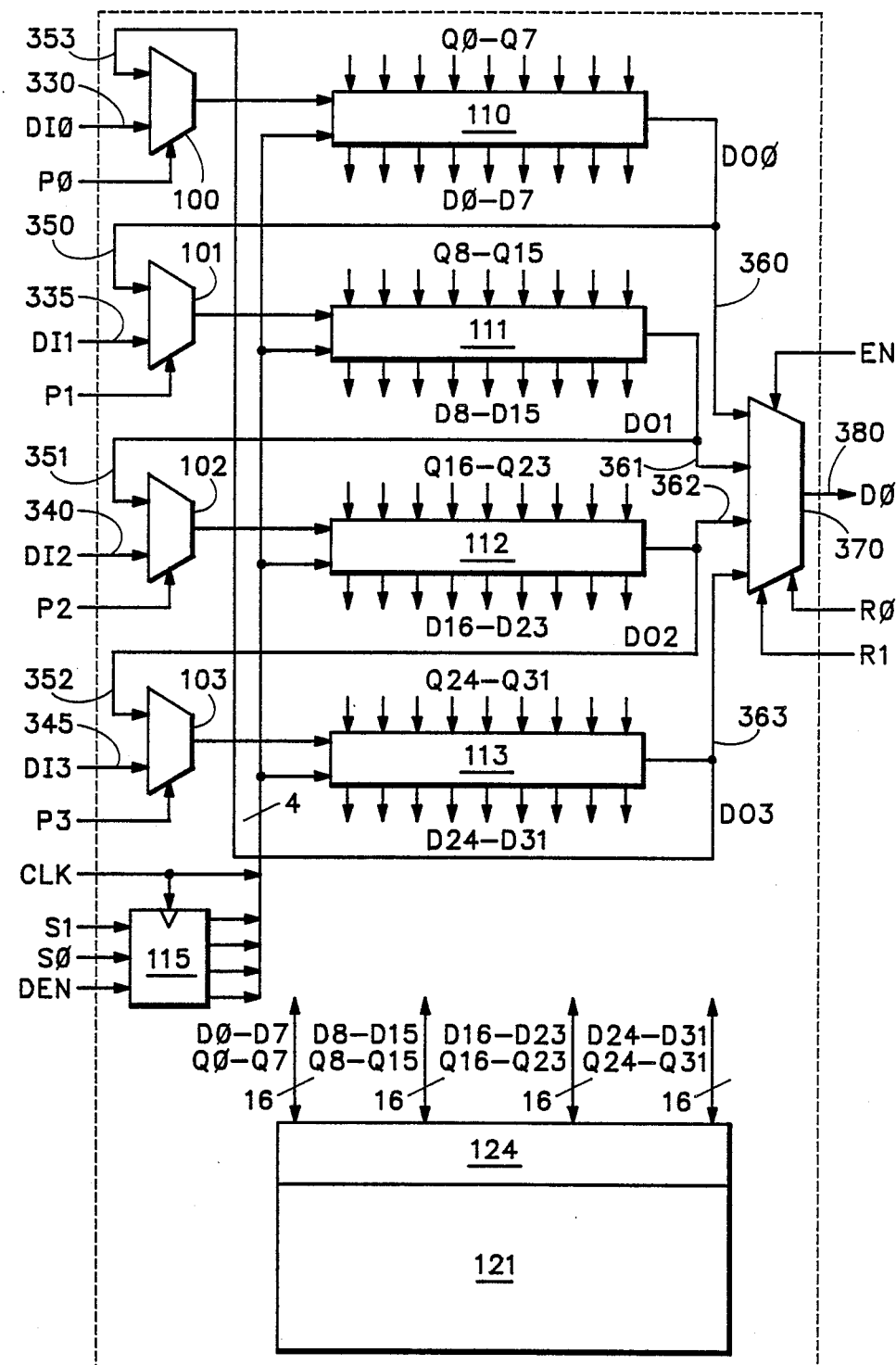
FIG. 6 is a schematic block diagram of a memory unit in accordance with the present invention and of a type suitable for being employed in the system shown in FIG. 5 which includes features for minimizing the external circuitry required for constructing systems using such memory units.

Referring now to FIG. 6, the components of a representative memory unit, such as the memory unit 320, are shown in greater detail as implemented on a single integrated circuit chip 299. The shift/shadow registers 110-113 in such representative memory unit receive, in this case, the most significant bits of data over the leads 330 (signal DI$\phi$), 335 (signal DI1), 340 (signal DI2) and 345 (signal DI3) from the A/D converters 300, 301, 302 and 303, respectively.

The structure of the memory unit 320 is identical with that of the memory unit 40 shown in FIGS. 1 and 2, except for the internal connection lines 350-353 and 360-363 and the 4×1 output multiplexer 370. The connection lines 350-353 couple the "alternative" inputs of the multiplexers 100-103 to the outputs of the shift/shadow registers 113, 110, 111, and 112, respectively. The connection lines 360-363 couple the outputs of the shift/shadow registers 110-113 to the output multiplexer 370. The output multiplexer 370 allows data from any one of the outputs (signals D0$\phi$-D03) of the registers 110-113 to be selected for readout (signal D$\phi$) from the memory unit 320 on line 380 in response to the control signals R$\phi$ and R1 provided over the bus line 396. The input multiplexers 100-103 each receive a separate control signal P$\phi$-P3 over the bus 396. The control signals P$\phi$-P3 regulate the internal routing of data between the registers 110-113. It should be noted that each of the memory units 320-323 receives the same set of control signals P$\phi$-P3 over the bus line 396.

The functional combination provided by the internal connection lines 350-353 and 360-363 and the output multiplexer 370 provides an especially effectual arrangement for fully utilizing the memory capacities of the memory units 320-323 regardless of the number of channels A-D in use. When all of the channels A-D are in use the control signals P$\phi$-P3 are all set high so that each of the registers 110-113 in each of the memory units 320-323 is utilized in recording data into the memory array 121 from a different A/D converter 300-303. The data words from the different A/D converters 300-303, corresponding to different signals on the channels A-D, are then subsequently reconstructed through the action of the output multiplexers (such as the multiplexer 370) in the memory units 320-323. The output multiplexers in all of the memory units 320-323 are controlled by the same control signals R$\phi$ and R1 for simultaneously selecting data for output over the lines 380-383 (shown in FIG. 5) corresponding to input received from the same A/D converter 300-303. Data are selected as required from the four shift/shadow registers (such as the registers 110-113 in FIG. 6) in each of the memory units 320-323 in order to allow access to the proper data for reconstructing the original data words received from each of the A/D converters 300-303.

The memory capabilities of the memory units 320-323 can be fully utilized when only channels A and C or channels B and D are in use by properly setting the control signals P$\phi$ through P3. For example, when only the two channels channels A and C are in use the control signals P1 and P3 can be set low so that data are routed over the connection lines 350 and 352 from the outputs of the registers 110 and 112 to the inputs of the registers 111 and 113, respectively, in each of the memory units 320-323. The memory capacity of each memory unit can thereby be fully utilized and twice as much memory be made available for data corresponding to each of the channels, A and C in use. The memory capabilities of the memory units 320-323 can likewise be fully utilized when only a single channel is in use. For example, when only channel A is in use, the control signals P1, P2 and P3 can be all set low so that data are routed over the connection lines 350, 351 and 352 from the outputs of the register 110, 111 and 112 to the inputs of registers 111, 112 and 113, respectively, in each of the memory units 320-323. The memory of each memory unit can thereby be fully utilized and four times as much memory be made available for data corresponding to the channel in use.

Whenever data are routed internally in the memory units 320-323 using the input multiplexers 100-103, the operation of the output multiplexer 370 must be adjusted to select only data from the appropriate output signals D0$\phi$-D03 of the shift/shadow registers 110-113. For example, if only channel A is in use, and signals P$\phi$-P2 are low, only data from signal D03 on line 363 from register 113 should be selected. Furthermore, it should be noted that the timing of data transfer operations between the registers 110-113 and the memory component 120 must be modified whenever data are internally routed between the registers 110-113 in the memory units 320-323. For example, when channels A and C are in use, and signals P1 and P3 are low, data transfer to memory should take place at only half the frequency (with 16 bits being transferred during each cycle) as compared to the situation when all of the channels A-D are in use.

Referring now again to FIG. 5, the memory units 320-323 provide output signals D$\phi$-D3 comprised of bits of different significance levels on the output lines 380-383, respectively. The lines 380-383 are combined to form the line 390 which has four leads for carrying four bits of data in parallel and which is connected to the permanent memory component 92. The memory controller 395 provides the same control signals P$\phi$-P3, S$\phi$-S1, EN and R$\phi$-R1 over the bus 396 line to each of the memory units 320-323. The microprocessor 394 provides the required control signals over the bus 98 for writing the data supplied on the line 390 into the memory component 92. Through the use of the internal connection lines and output multiplexers in the memory units 320-323 the need for external "glue logic" such as the external connections between the memory units 320-323 and the need for an external multiplexer (such as multiplexer 90 shown in FIG. 1) is avoided.

Figure 7:
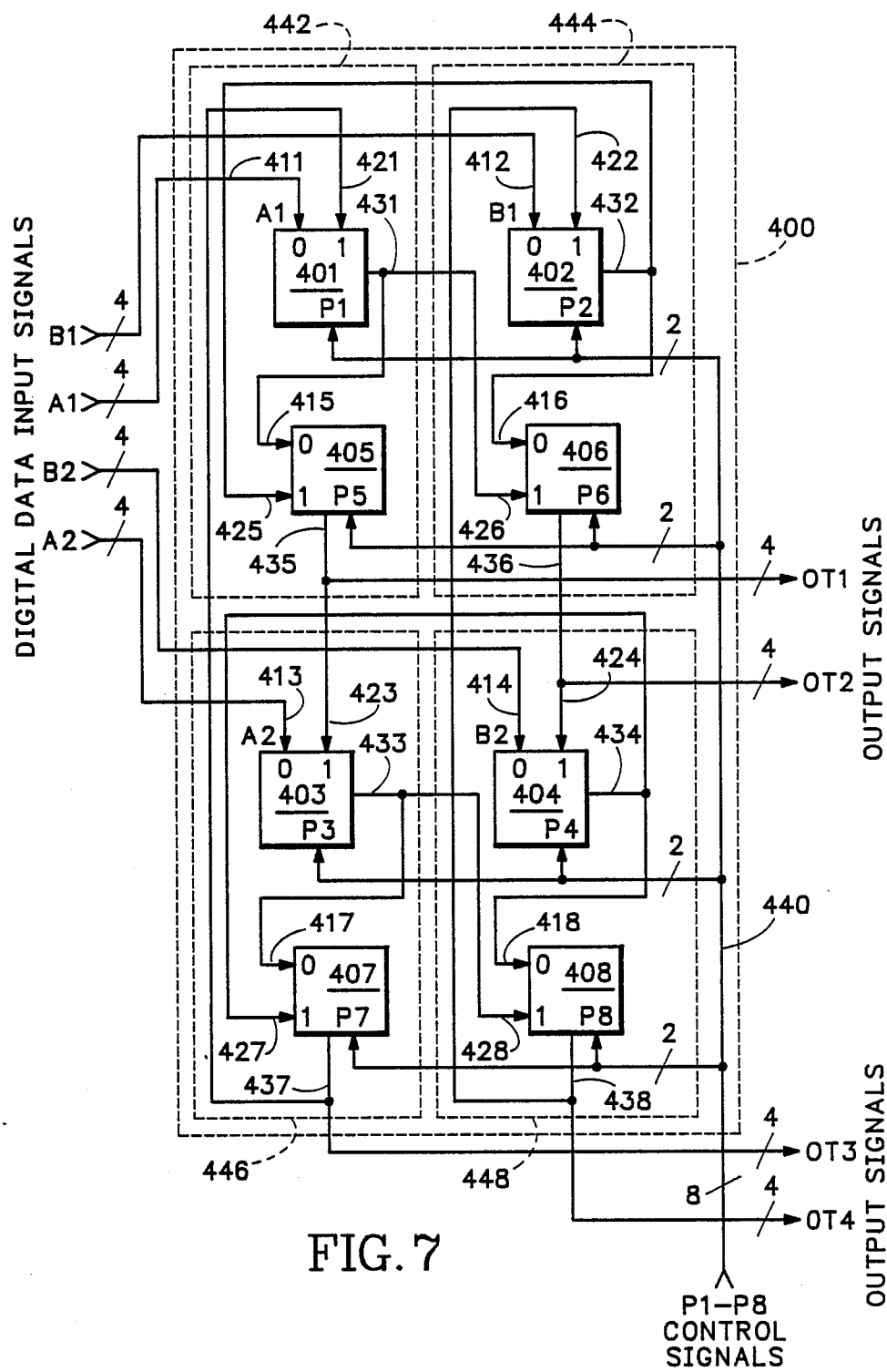
FIG. 7 is a schematic block diagram of a memory system comprised of a matrix of interconnected memory units of the type shown in FIG. 2 which allows for efficiency and flexibility in using the memory capacities of the memory units in the matrix.

Referring now to FIG. 7 an additional type of memory system 400 is shown which employs eight memory units 401-408 of the type illustrated in FIG. 2 which are interconnected to form a memory matrix. The input signals A1, A2, B1 and B2 constitute streams of digital data in four-bit words provided at high speeds from digital sources such as A/D converters. All of the data lines 411-418, 421-428 and 431-438 connecting the memory units 401-408 represent sets of four leads for carrying four bits of data in parallel. The groups of lines 411-418 and 421-428 represent primary and alternative input lines to the memory units 401-408 which are selected in response to the control signals P1-P8 provided over the control line 440 from a microprocessor. Each pair of lines 411 and 421, 412 and 422, 413 and 423, 414 and 424, 415 and 425, 416 and 426, 417 and 427, and 418 and 428 functionally corresponds to the pair of lines 50 and 60 in FIG. 2, respectively, in terms of providing alternate input paths to the memory units 401–408. The numbers (either 0 or 1) in proximity to input connections to the memory units 401–408 indicate logic states for the control signals P1–P8, respectively. Each number corresponds to the logic state for the requisite control signal which selects the input line across from which the number is positioned.

Each of the memory units 401–408 includes a "primary" data input line and an "alternative" data input line and a single data output line. The memory units 401–408 may be considered to be grouped into pairs 442, 444, 446 and 448. A representative pair, such as the pair 442, comprises the complementary units 401 and 405. The memory unit 401 is connected line 411 for receiving an "original" input data signal A1. The output of memory unit 401 on line 431 is connected to the input of unit 405 on line 415 for allowing data to be routed within the pair 442 from the unit 401 (which receives input data from outside the system) to the unit 405 (which provides output data from inside the system). The output of the memory unit 405 on line 435 is connected for furnishing the system output signal OT1.

The pair 442 is interconnected to the other pairs in the matrix so that two different inputs can be received by the units 401 and 405 over their alternative input lines 421 and 425 from memory units (407 and 402) located in other pairs of such units on lines 426 and 423. Further, the pair 442 is interconnected to the other pairs so that the outputs from the units 401 and 405 on lines 431 and 435 can be received by memory units (406 and 403) located in other pairs of such units. Each of the pairs 442 444, 446 and 448 is constructed and arranged for receiving input data from two other pairs of units for providing output data to two other pairs of units, for receiving a data stream from a digital data source, and for providing a data output stream from the system 400.

The usefulness of the memory system 400 in allowing the memory capacities of the units 401–408 to be efficiently utilized can be demonstrated with reference to Table I which shows the logic states of the control signals PI–P8 for use in controlling the interconnections between the units 401–408 for five different exemplary input signal combinations.

TABLE I

| | P1 | P2 | P3 | P4 | P5 | P6 | P7 | P8 |
|---|---|---|---|---|---|---|---|---|
| A1 Only | 0 | 1 | 1 | 1 | 0 | 0 | 1 | 1 |
| A1,B1 | 0 | 0 | 1 | 1 | 0 | 0 | 0 | 0 |
| A1,A2 | 0 | 1 | 0 | 1 | 1 | 1 | 1 | 1 |
| A1,B2 | 0 | 1 | 1 | 0 | 0 | 0 | 0 | 0 |
| A1,A2,B1,B2 | 0 | 0 | 0 | 0 | 0 | 0 | 0 | 0 |

When processing only the data signal A1, the memory units are connected output to input so that data can flow from unit 401 to 405 to 403 to 408 to 402 to 406 to 404 to 407. The output data corresponding to A1 can then be furnished on line 437 as signal OT3. When processing data signals A1 and B1, the memory units 401–408 are connected so that data can flow from unit 401 to 405 to 403 to 407 and from unit 402 to 406 to 404 to 408. The output data corresponding to A1 and B1 can then be furnished on lines 437 and 438 as signals OT3 and OT4. When processing data signals A1 and A2, the memory units 401–408 are connected so that data can flow from unit 401 to 406 to 404 to 407 and from unit 403 to 408 to 402 to 405. The output data corresponding to A1 and A2 can then be furnished on lines 437 and 435 as signals OT3 and OT1. When processing the signals A1 and B2, the memory units 401–408 are connected so that data can flow from unit 401 to 405 to 403 to 407 and from unit 404 to 408 to 402 to 406. The output data corresponding to A1 and B2 can then be furnished on lines 437 and 436 as signals OT3 and OT2. When processing all four data signals A1, A2, B1 and B2, the memory units 401–408 are connected so that data can flow from unit 401 to 405, from unit 402 to 406, from unit 403 to 407 and from unit 404 to 408. The output data corresponding to A1, A2, B1 and B2 can then be furnished on lines 435, 437, 436 and 438 as signals OT1, OT3, OT2 and OT4. It should be noted that the memory system 400 can be configured so as to fully utilize the memory capabilities of the units 401–408. When any single channel or combination of two channels is in use.

As may be apparent from the preceding description, certain changes may be made in the above constructions without departing from the scope of the invention. For instance, the number of input channels, the number of bits per word, the number of memory units employed, the length of the shift/shadow registers, etc. can all be changed according to the particular requirements for the system being designed. Therefore, the embodiments described and the drawings are intended to be illustrative in nature and are not meant to be interpreted as limiting the following claims.

We claim:

1. A memory system comprising:
    a plurality of memory units interconnected so that output data provided from each of the memory units can serve as an alternative input data to one of the other memory units in the system, each of said memory units including:
    a read/write memory array constructed on a single substrate and including a plurality of randomly accessible memory cells for storing digital data;
    a plurality of shift registers constructed on said substrate, each of said shift registers operative for receiving a stream of serial input data and transferring these data in parallel to said memory array and for receiving data in parallel from said memory array and for converting these data into a stream of serial output data;
    a plurality of shadow registers constructed on said substrate, one of which is connected between each of said shift register and said memory array for buffering the transfer of data from said shift registers to said array; and
    a plurality of input multiplexers constructed on said substrate, one of which multiplexers is connected to each of said shift registers for selecting the stream of input data to be supplied to the shift register to which it is connected.

2. The system of claim 1, wherein each of said memory units further includes:
    an output multiplexer constructed on said substrate which is connected for receiving the streams of serial output data provided by said shift registers and for selecting a stream of data to be supplied as output data from the memory unit with which the output multiplexer is associated in response to a set of output control signals.

3. A memory unit comprising:
    an integrated circuit chip having a set of primary data input lines, a set of alternative data input lines and a set of input control lines, and including:

(a) a read/write random access memory array, (b) a plurality of shift/shadow registers each of which is operative for converting a serial input data stream into data in parallel and supplying these data to said memory array and for receiving data in parallel from said memory array and converting these data into a serial output data stream, and (c) a plurality of input multiplexers one of which is associated with each of said shift/shadow registers for selecting between different input data streams supplied on said primary and alternative data input lines in response to control signals provided on said input control lines.

4. The memory unit of claim 3, in which said integrated circuit chip also has a set of output control lines and further includes:

(d) an output multiplexer which is connected to each of said shift/shadow registers for selecting among the output data streams provided by said shift/shadow registers in response to control signals supplied on said output control lines.

5. The memory unit of claim 3, wherein:

said memory array is implemented using CMOS technology and said shift/shadow registers are implemented using ECL technology.

6. A memory system comprising:

a plurality of memory units each of which comprises a single integrated circuit chip having primary and alternative sets of input data lines, a set of output data lines and a set of input control lines and each of which includes:

(a) a read/write RAM memory array, (b) a plurality of means for converting a serial input stream into data in parallel and supplying these data to said array and for receiving output data in parallel from said array and converting these data into a serial output stream, and (c) a plurality of input multiplexers for selecting between data supplied on said primary set of data lines and data supplied on said alternative set of data lines in response to control signals supplied over said control lines, said memory units interconnected so as to form a structure in which the alternative input lines for each memory unit are connected to the output lines for one of the other memory units in the system.

7. The memory system of claim 6, further including:

means for selecting data from only one of said memory units at one time for output from said system in order to avoid interference between output data from different memory units.

8. The memory system of claim 6, wherein:

said memory units in said structure are further interconnected to form a matrix in which complementary pairs of memory units which are connected together are also connected for receiving an input data stream from outside said matrix, for providing an output data stream from said matrix, and for receiving and providing two input data streams from and two output data streams to other pairs of units in said matrix.

9. A memory system for efficiently utilizing the memory capacities of a plurality of separate memory units in storing data from a variable number of input streams of data words consisting of data bits, said system comprising:

a plurality of memory units each of which is connected for receiving bits in accordance with their significance level from the words in said input streams and each of which comprises an integrated circuit chip including:

(a) a read/write RAM memory array, (b) a plurality of means for converting a stream of bits of serial input data into data in parallel and supplying these data to said memory array and for receiving data in parallel from said memory array and converting these data into a stream of bits of serial output data, (c) a plurality of input multiplexers one of which is coupled to each of said means for converting data and each of which is connected for alternatively receiving either a stream of data bits from one of said input data word streams or a stream of serial output data bits from one of the means for converting data to which it is not coupled, and each of which is operative for selecting one of these streams of data bits in response to an input control signal provided to each of these multiplexers and directing data from the selected stream to the means for converting data to which it is coupled, and (d) an output multiplexer which is connected for receiving the serial output data bit streams from said plurality of means for converting data and which is operative for selecting a particular stream of this data for output from said integrated circuit chip in response to control signals provided to this multiplexer.

10. A memory unit for use in a digital system for providing programmable memory capabilities, said unit comprising:

an integrated circuit chip having a set of data input lines and a set of input control lines and including:

(a) a static RAM memory array, (b) a plurality of shift/shadow registers for converting serial input data streams into data in parallel and transferring these data to said memory array and for receiving data in parallel from said memory array and converting these data into serial output data streams, and (c) a plurality of input multiplexers one of which is associated with each of said shift/shadow registers and each of which has a primary input connected to one of said input lines to said chip and an alternative input connected to the output of a shift/shadow register other than the register with which it is associated, and each of which is operative for selecting between data provided on said primary input and data provided on said alternative input in response to control signals provided on one of said control lines.

11. The memory unit of claim 10, in which said integrated circuit chip also has a set of output control lines and further includes:

(d) an output multiplexer which is connected to each of said shift/shadow registers for selecting among the output data streams provided by said shift/shadow registers in response to control signals supplied on said output control lines.

* * * * *